(12) United States Patent
Morley

(10) Patent No.: US 10,063,199 B2
(45) Date of Patent: Aug. 28, 2018

(54) BUFFER WITH INCREASED HEADROOM

(71) Applicant: Analog Devices Global, Hamilton (BM)

(72) Inventor: Sean T. Morley, Limerick (IE)

(73) Assignee: Analog Devices Global, Hamilton (BM)

( * ) Notice: Subject to any disclaimer, the term of this patent is extended or adjusted under 35 U.S.C. 154(b) by 36 days.

(21) Appl. No.: 15/178,217

(22) Filed: Jun. 9, 2016

(65) Prior Publication Data
US 2017/0359041 A1    Dec. 14, 2017

(51) Int. Cl.
| | |
|---|---|
| H03F 3/45 | (2006.01) |
| H03F 3/19 | (2006.01) |
| H03F 3/193 | (2006.01) |
| H03F 3/21 | (2006.01) |
| H03F 1/32 | (2006.01) |

(52) U.S. Cl.
CPC ........... *H03F 3/45273* (2013.01); *H03F 3/19* (2013.01); *H03F 3/193* (2013.01); *H03F 3/21* (2013.01); *H03F 3/45174* (2013.01); *H03F 1/3211* (2013.01); *H03F 3/45071* (2013.01); *H03F 3/45085* (2013.01); *H03F 3/45183* (2013.01); *H03F 2200/165* (2013.01); *H03F 2200/451* (2013.01); *H03F 2200/456* (2013.01); *H03F 2200/69* (2013.01); *H03F 2200/72* (2013.01); *H03F 2203/45112* (2013.01)

(58) Field of Classification Search
CPC .......... H03F 3/45273; H03F 3/45; H03F 3/19; H03F 3/193; H03F 3/21; H03F 3/45174; H03F 1/3211; H03F 3/45076; H03F 3/4508

USPC .......................................... 330/252, 257, 261
See application file for complete search history.

(56) References Cited

U.S. PATENT DOCUMENTS

| | | | |
|---|---|---|---|
| 5,177,451 A | 1/1993 | Lehmann | |
| 7,728,667 B2 * | 6/2010 | Sugihara | H03F 1/3211 330/261 |
| 7,898,339 B2 * | 3/2011 | Ikeda | H03F 1/223 330/285 |

(Continued)

OTHER PUBLICATIONS

Blencowe, Merlin, "GlassBlower: High-Headroom Buffer/Boster," available Feb. 4, 2016 in 2 pages at the following link: http://www.valvewizard.co.uk/glassblower.html.

(Continued)

*Primary Examiner* — Khanh V Nguyen
(74) *Attorney, Agent, or Firm* — Knobbe, Martens, Olson & Bear, LLP

(57) ABSTRACT

Provided herein are amplifiers, such as buffers, with increased headroom. An amplifier stage includes a follower transistor and current source configured to receive a power supply voltage comprising an alternating current component and a direct current component. The alternating current component of the power supply voltage has substantially the same frequency and magnitude as the input signal received by the follower transistor. In radio frequency (RF) and intermediate frequency (IF) buffer applications, for example, the increased headroom can allow for linear buffering of an input signals with increased amplitude so that the output power one decibel (OP1dB) compression point can be increased.

20 Claims, 6 Drawing Sheets

(56) References Cited

U.S. PATENT DOCUMENTS

| 9,035,696 B2* | 5/2015 | Sugimoto | H03F 3/087 |
| | | | 330/259 |
| 2010/0271127 A1* | 10/2010 | Zametzky | H03F 1/0222 |
| | | | 330/252 |
| 2013/0127371 A1 | 5/2013 | Sarig et al. | |

OTHER PUBLICATIONS

Kollman, Robert, "Power Tip 42 (Part 1): Discrete devices-a good alternative to integrated MOSFET drivers," EETimes, Dec. 9, 2011, 4 pages.

Smith et al., "Evolution of High-Speed Operational Amplifier Architectures," IEEE Journal of Solid-State Circuits, Oct. 1994, pp. 1166-1179, vol. 29, No. 10.

Barthelemy, H., "Low-output-impedance class AB bipolar voltage buffer," Electronic Letters, Sep. 25, 1997, pp. 1662-1664, vol. 33, No. 20.

* cited by examiner

BUFFER WITH INCREASED HEADROOM

TECHNICAL FIELD

The disclosed technology relates to electronic circuits, and, more particularly, to amplifiers such as buffers.

DESCRIPTION OF THE RELATED TECHNOLOGY

A buffer circuit or buffer amplifier can buffer an input signal from a first circuit, having a higher output impedance, to a second circuit with a lower impedance. Ideally, a buffer circuit provides a non-distorted output signal replicating the input signal to the second circuit and prevents the second circuit from loading the first circuit. In one application, a buffer circuit is used to buffer an amplifier output signal to a co-axial cable with low impedance.

Related technology includes low-distortion amplifiers and buffers designed for high common-mode range. High common-mode range amplifiers and buffers can provide linear operation for input signals with amplitudes reaching the supply rail voltage. One example of a high common-mode range amplifier is a wide-swing input amplifier.

Related technology also includes amplifiers, buffers, and systems designed to provide a desirable one-decibel compression point. Measured in terms of either an output power level (OP1dB) or an input power level (IP1dB) in units of decibels, the one-decibel compression point refers to where a system's output power signal, as a function of an input power signal, becomes non-linear.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an apparatus comprises a follower transistor and a current source. The follower transistor is configured to receive an input signal and to provide a buffered version of the input signal at an output. The current source is configured to provide a bias to the output of the follower transistor and to receive a power supply voltage comprising an alternating current component and a direct current component. The alternating current component of the power supply voltage has substantially the same frequency as the input signal received by the follower transistor.

The alternating current component of the power supply voltage can have substantially the same magnitude as the input signal received by the follower transistor. The power supply voltage can comprise the input signal superimposed on a supply voltage. A node in a signal path to the input of the follower transistor can provide the power supply voltage. The apparatus can further comprise a mixer and a direct current blocking capacitor, and the signal path can be from an output of the mixer to the input of the follower transistor. The direct current blocking capacitor can be electrically coupled between the node in the signal path and the input of the follower transistor.

The input signal can be an intermediate frequency signal. The follower transistor can be included in an input stage of a diamond buffer. The diamond buffer can be a class AB diamond buffer.

The apparatus can further comprise an other follower transistor configured to buffer the input signal; and the follower transistor and the other following transistor can be of opposite conductivity types.

The current source can comprise a current mirror.

The apparatus can further comprise a second follower transistor and a second current source. The second follower transistor can be configured to receive a second input signal and to provide a buffered version of the second input signal. The first input signal and the second input signal can be differential signals. The second current source can be configured to provide a second bias to an output of the second follower transistor. The second source can be configured to receive a second power supply voltage that is different than the power supply voltage.

The apparatus can further comprise a second stage follower transistor and a second stage current source. The second stage follower transistor can be configured to receive the buffered version of the input signal and to provide an output signal. The second stage current source can be configured to receive a different power supply voltage than the power supply voltage received by the current source; and the second stage current source can be configured to provide a second stage bias to an output of the second stage follower transistor.

The follower transistor can be a bipolar transistor. The base of the bipolar transistor can be configured to receive the input signal, and the collector of the bipolar transistor can be configured to provide the buffered version of the input signal.

In another aspect, an electronic system comprises a mixer, a buffer amplifier, and a signal path between an output of the mixer and an input of the buffer amplifier. The buffer amplifier comprises a follower transistor and a current source. The follower transistor is configured to buffer an input signal received at the input of the buffer amplifier. The current source is configured to bias an output of the follower transistor. The current source is configured to receive a power supply voltage from a node in the signal path.

The signal path can comprise a direct current blocking capacitor electrically coupled between the node in the signal path and the input of the buffer amplifier. The signal path can comprise a filter electrically coupled between the output of the mixer and the node in the signal path.

In another aspect, an apparatus comprises a transistor and a current source. The transistor is configured to receive an input signal and to provide an output signal in response to the input signal. The current source is configured to bias an output of the transistor. The current source is configured to receive a power supply signal having an alternating current component and a direct current component. The current source is configured to bias the transistor such that the common mode range of the input signal is increased by an amount proportional to the alternating current component.

The apparatus can further comprise a coupling network having an input and an output. The input can be electrically coupled to the current source, and the output can be electrically coupled to an input of the transistor.

The current source can comprise a first bipolar transistor, and the transistor can comprise a second bipolar transistor configured as an emitter follower. The first bipolar transistor and the second bipolar transistor can be PNP transistors.

The current source can comprise a field effect transistor; and the transistor can comprise a field effect transistor configured as a source follower.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION OF CERTAIN EMBODIMENTS

Figure 1A:
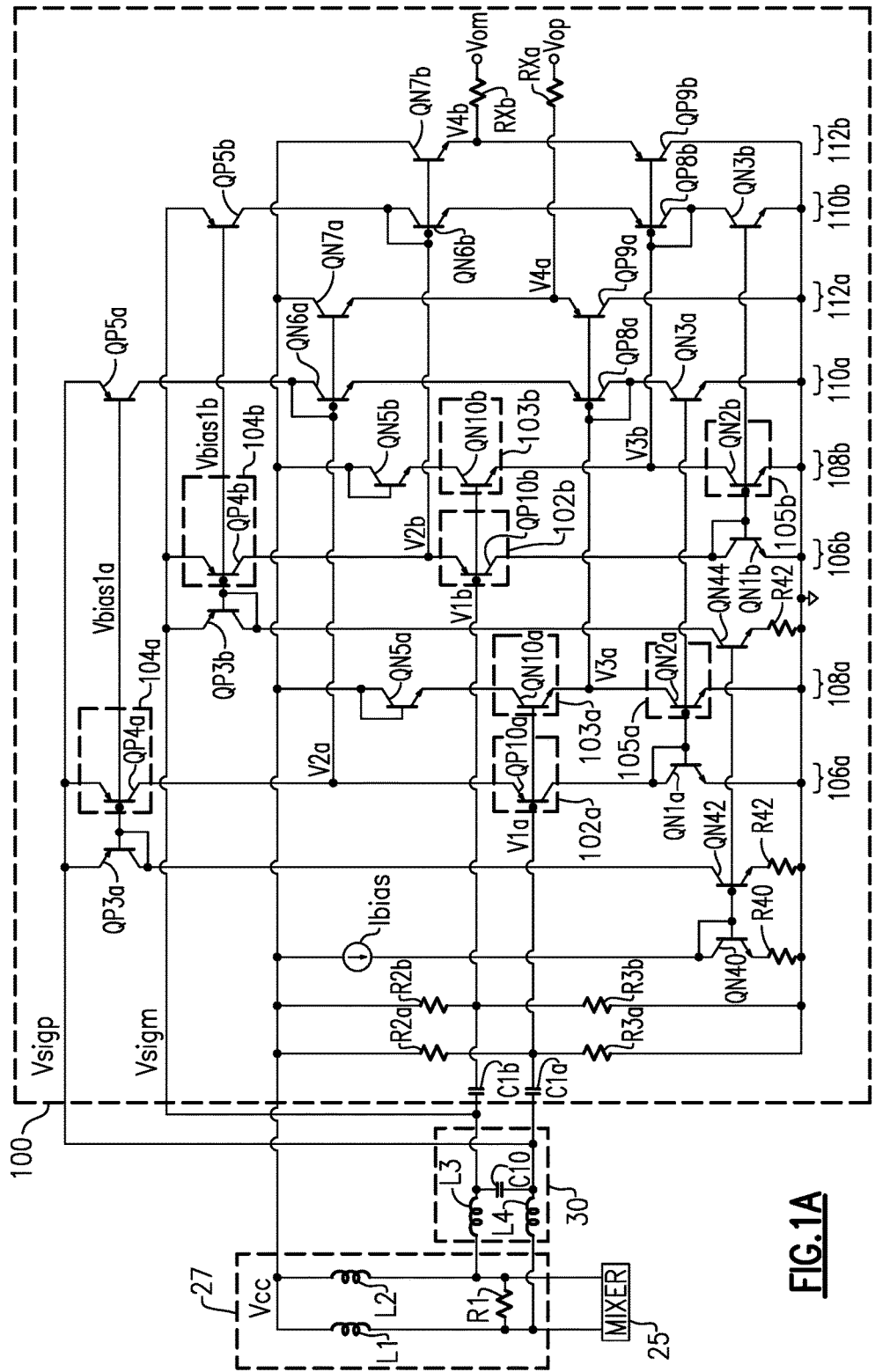
FIG. 1A is a schematic diagram of an electronic system that includes a diamond-style class AB intermediate frequency (IF) buffer in accordance with the teachings herein.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The simplest of amplifier stages can be a transistor that is a three-terminal transistor such as a bipolar junction transistor (BJT) or a field effect transistor (FET). When connected with a load, such as a current source or an impedance element, a BJT can be configured as a common-emitter, common-collector, or common-base amplifier. Similarly, a FET can be configured as a common-source, common-drain, or common-gate amplifier. Input signals of interest can range, for example, from audio frequency to radio frequency (RF) with variable amplitude and phase. An amplifier stage can be used to buffer and/or amplify the input signal and to provide an output signal with increased power.

Linearity can be a significant amplifier stage specification. Ideally, an amplifier stage can provide an output signal with little or no distortion. The more linear the amplifier stage, the less distortion the output signal should exhibit. In radio frequency (RF) and intermediate frequency (IF) amplifiers and amplifier stages devoted to amplifying power signals, linearity can be measured by comparing output signal power to input signal power so as to extract an output power (OP1dB) and input power (IP1dB) data point in decibels (dB). The OP1dB and IP1dB can represent where the output power versus input power deviates from a substantially straight line. An RF signal can have a frequency in a range from about 30 KHz to 300 GHz, such as a range from about 450 MHz to 5 GHz. An IF frequency is typically less than an RF frequency. An IF signal can have a frequency in a range from about 100 MHz to 600 MHz, for example. A local oscillator (LO) signal can be mixed with an RF signal to downshift the RF signal to a lower frequency.

In amplifiers and amplifier stages, linearity can be limited by the supply voltage. For instance, in a common emitter single-stage transistor amplifier, the BJT can saturate and clip the output signal when the input signal strength or input amplitude becomes larger than allowed by an operating load line. The 1 dB compression point (e.g., OP1dB) in an IF or RF amplifier can occur at or near where the amplifier saturates and clips signals. Typically, the operating load line, which can be referred to as the "load line", limits the maximum output signal to be less than the supply voltage, and the maximum available amplifier input swing is limited by the gain relationship between the input signal and output signal. For instance, if an amplifier stage is configured as a unity gain buffer, then the maximum alternating current (AC) input signal swing is less than or equal to the maximum AC output signal swing. In amplifier stages and in multi-stage amplifiers including operational amplifiers (op-amps) and buffers, available input signal swing can be specified by common-mode range (CMR). The CMR can define the range of input signals over which the amplifier or buffer can operate without clipping the output signal.

As technology pushes the trend to use lower supply voltages while availing the maximum available amplifier input signal swing, circuit approaches to address the supply voltage headroom and CMR can become increasingly significant. The teachings herein present apparatus and methods for extended common-mode range buffers. By powering amplifier stages from interfacing input signals, the maximum signal swing can be increased so as to avail more headroom. This can in turn allow the individual stages and buffer to operate linearly for larger input signals. In an RF or IF buffer, the OP1dB can be increased by replacing the supply voltage with an input signal having a DC component; the DC component can be equal or almost equal to the supply voltage.

In certain amplifiers, headroom can be limited by a current source biasing a transistor configured as a follower in an input stack of an amplifier. For instance, current sources biasing NPN and PNP followers in the input stacks of a diamond-style class-AB input buffer can limit headroom of the buffer. A signal provided to an emitter of a PNP input transistor may only swing to within a few hundred millivolts of a power supply voltage before the output impedance of the current source biasing this point collapses in such an amplifier. Similarly, the signal at the emitter of an NPN input transistor may only swing to within a few hundred millivolts of ground before the output impedance of the current source biasing this point collapses. Challenges associated with headroom are also present in other amplifier topologies.

Aspects of this disclosure relate to providing a voltage boost to a current source biasing an input transistor, in which the voltage boost can correspond to a change on the input signal that is buffered or otherwise amplified by the input transistor. In certain embodiments, the headroom in a buffer amplifier can be increased by superimposing the input signal on a supply voltage for a biasing current source. When the input signal swings towards the amplifier supply voltage, the power supply voltage for the current source also move higher to create additional headroom that can enable a larger amplitude input signal to be accommodated without clipping.

In an embodiment, a buffer includes a follower transistor configured to buffer an input signal and a current source configured to bias an output of the follower transistor. The current source is configured to receive a power supply voltage having an alternating current component and a direct current component, in which the alternating current component has substantially the same frequency and magnitude as the input signal received by the follower transistor. The current source can bias the follower transistor such that an output signal provided by the follower transistor can achieve a voltage magnitude that is greater than a voltage magnitude of the direct current component of the power supply signal.

FIG. 1A is a schematic diagram of an electronic system that includes a diamond-style class AB intermediate frequency (IF) buffer 100 in accordance with the teachings herein. Class AB buffers can be used to provide current gain with relatively low distortion. The illustrated diamond-style class AB buffer is a unity gain buffer using cascaded complementary bipolar transistors configured as emitter followers. The teachings herein can be particularly well suited to improve the range of signals for which a unity gain buffer operates with low distortion because a unity gain buffer can provide current amplification while keeping the voltage gain approximately equal to unity or less.

The electronic system of FIG. 1A further includes the buffer 100, a mixer 25, a mixer load 27, and a filter 30. The mixer load 27 includes a bias inductor L1, a bias inductor L2, and a resistor R1. The mixer 25 can use bias inductors L1 and L2 so as to enhance the mixer input power IP1dB when operating from a supply voltage, such as a 3.3V supply voltage. The resistor R1 can be configured to operate as a load so as to set a mixer conversion gain, as the buffer 100 can have a relatively high input impedance.

The filter 30 includes a filter inductor L3, a filter inductor L4, and a filter capacitor C10. The filter 30 is coupled between the mixer 25 and the buffer 100. The filter 30 can filter IF signals generated by the mixer 25.

As illustrated, the buffer 100 includes a DC blocking capacitor C1a, a DC blocking capacitor C1b, a resistor R2a, a resistor R2b, a resistor R3a, a resistor R3b, a current source Ibias, a resistor R40, a resistor R42, a resistor R44, a resistor RXa, a resistor RXb, an NPN bipolar junction transistor (NPN) QN40, an NPN QN42, an NPN QN44, an NPN QN1a, an NPN QN2a, an NPN QN3a, an NPN QN5a, an NPN QN6a, an NPN QN7a, an NPN QN10a, an NPN QN1b, an NPN QN2b, an NPN QN3b, an NPN QN5b, an NPN QN6b, an NPN QN7b, an NPN QN10b, a PNP bipolar junction transistor (PNP) QP3a, a PNP QP4a, a PNP QP5a, a PNP QP8a, a PNP QP9a, a PNP QP10a, a PNP QP3b, a PNP QP4b, a PNP QP5b, a PNP QP8b, a PNP QP9b, and a PNP QP10b.

Current biasing is set by a current source Ibias and input DC bias levels are set by resistor dividers using resistors R2a, R3a and R2b, R3b. As shown in FIG. 1A, the IF buffer 100 receives a differential input voltage given by the difference of a first input signal V1a and a second input signal V1b and provides a differential output voltage given by the difference of a first output signal Vop and a second output signal Vom.

The external bias inductor L is connected between a DC supply Vcc and a first output of the mixer 25. The external bias inductor L2 is connected between the DC supply Vcc and a second output of the mixer 25. The filter inductor L3 is connected between the second output of the mixer 25 and a first terminal of the DC blocking capacitor C1b, and the filter inductor L4 is connected between the first output of the mixer 25 and a first terminal of the DC blocking capacitor C1a. Additionally, the filter capacitor C10 is connected between the first terminal of the DC blocking capacitor C1b and the first terminal of the DC blocking capacitor C1a.

The filter inductors L3, L4 with the filter capacitor C10 together operate to filter signals from the first and second outputs of the mixer 25 so as to provide a noninverting input signal Vsigp at the first terminal of the DC blocking capacitor C1a and an inverting input signal Vsigm at the first terminal of the DC blocking capacitor C1b. By virtue of the external bias inductors L1, L2 and filter inductors L3, L4, the noninverting and inverting input signals Vsigp and Vsigm can have a DC component equal or almost equal to the DC supply Vcc and an IF AC component determined by the mixer 25. Thus, the noninverting and inverting input signals Vsigp and Vsigm can have signal swings above and below the DC supply Vcc.

A second terminal of the DC blocking capacitor C1a, which defines the noninverting buffer input node, is connected to a base of the PNP QP10a, to a base of the NPN QN10a, to a first terminal of the resistor R2a, and to a first terminal of the resistor R3a. The resistors R2a and R3a are connected between the DC supply Vcc and ground to form a resistor divider which can provide a first DC bias at the first terminal of the resistors R2a and R3a. The DC blocking capacitor C1a passes the AC component of the noninverting input signal Vsigp while the resistors R2a and R3a provide the first DC bias so that the first input signal V1a has a value determined by the first DC bias plus the AC component of the input signal Vsigp.

Similarly, second terminal of the DC blocking capacitor C1b is connected to a base of the PNP QP10b, to a base of the NPN QN10b, to a first terminal of the resistor R2b, and to a first terminal of the resistor R3b. The resistors R2b and R3b are connected between the DC supply Vcc and ground to form a resistor divider which can provide a second DC bias at the first terminal of the resistors R2b and R3b. The DC blocking capacitor C1a passes the AC component of the inverting input signal Vsigm while the resistors R2b and R3b provide the second DC bias so that the second input signal V1b has a value determined by the second DC bias plus the AC component of the inverting input signal Vsigm.

Although the buffer 100 shows the first input signal V1a as receiving the first DC bias from a resistor divider formed by R2a and R3a and the second input signal V1b as receiving and the second input signal V1b as receiving the second DC bias from a resistor divider formed by R2b and R3b, other configurations are possible. For instance, the first and the second DC biases can be generated from external supply voltages. Also, the first and the second supply voltages can be tailored to have the same values or to have different values.

As will be discussed in more detail with respect to FIG. 1B, a circuit stack, which is included in an amplifier stage, can receive a supply voltage which is derived from an input signal such as the noninverting and inverting input signals Vsigp and Vsigm. In this way replacing the supply connection of the DC supply Vcc on select circuit stacks of an amplifier stage with a connection to the first terminal of the DC blocking capacitor C1a or C1b, a common mode range of the select circuit stacks can be increased. Increasing common mode range can allow an amplifier to have linear characteristics and improved OP1dB for a larger range of input signals Vsigp and Vsigm. The replacement of the supply connection to the first terminal of the DC blocking capacitor C1a and C1b is allowed by virtue of the DC component of the input signals Vsigp and Vsigm. As discussed above, the noninverting and inverting input signals Vsigp and Vsigm can have a DC component substantially equal to the DC supply Vcc.

As shown in FIG. 1A, the noninverting and inverting input signals Vsigp and Vsigm are readily available and can use existing circuit elements instead of adding components such as external inductors. Thus, using the noninverting and inverting input signals Vsigp and Vsigm can provide the benefit of increased headroom and common mode range without increasing layout area or component count. In some other embodiments, additional DC bias chokes can be implemented to create a supply voltage to relieve the headroom constraints.

When amplifier stages are connected to receive power from the noninverting or inverting input signals, the first and second DC bias voltages can advantageously be adjusted to allow more headroom for signals. For instance, the first and the second DC bias voltages can be made to have a higher DC potential than traditionally allowed when the circuit stacks are connected to the DC supply Vcc.

As shown in FIG. 1A, current biasing is implemented with a current source Ibias, an NPN bipolar junction transistor (NPN) QN40, and a resistor R40. The NPN QN40 has a base, emitter, and collector, and the current source Ibias is connected between the DC supply Vcc and the collector of the NPN QN40. The base and the collector of the NPN QN40 are connected together, and the resistor R40 is connected between the emitter of the NPN QN40 and ground. In this configuration the NPN QN40 is diode connected and connected in series with the resistor R40. As shown the base of the NPN QN40 is connected to a base of an NPN QN42 and to a base of an NPN QN44. A resistor R42 is connected between the emitter of NPN QN42 and ground to provide emitter degeneration to the NPN QN42, and a resistor R44 is connected between the emitter of NPN QN44 and ground to provide emitter degeneration to the NPN QN44. Additionally, the collector of QN42 is connected to a collector of a PNP bipolar junction transistor (PNP) QP3a. The PNP QP3a has a base connected to its collector and an emitter connected to the first terminal of the DC blocking capacitor C1a. In this way the PNP QP3a generates a bias voltage Vbias1a which is level shifted up to the noninverting input signal Vsigp. Similarly, the collector of NPN QN44 is connected to a collector of a PNP QP3b, and PNP QP3b has a base connected to its collector and an emitter connected to the first terminal of the DC blocking capacitor C b; and in this way the PNP QP3b generates a bias voltage Vbias1b which is level shifted up to the inverting input signal Vsigm. When NPNs QN40, QN42 and QN44 and resistors R40, R42, R44 are matched in layout, then a replica current Ibias is mirrored to the diode connected collector of PNP QP3a and the diode connected collector of PNP QP3b.

The diamond-style class AB intermediate frequency (IF) buffer 100 is a differential buffer with multiple circuit stacks. The core buffer circuit stacks are delineated as circuit stacks 106a-112a and circuit stacks 106b-112b.

The circuit stack 106a includes the PNP QP4a, the PNP QP10a, and the NPN QN1a. The circuit stack 108a includes the NPN QN5a, the NPN QN10a, and the NPN QN2a. Also, the circuit stack 110a includes the NPN QN6a, the PNP QP8a, and the NPN QN3a, and the circuit stack 112a includes the NPN QN7a and the PNP QP9a.

The circuit stacks 106a and 108a together form a diamond-style input amplifier stage which receives the first input signal V1a at the noninverting buffer input node; and circuit stacks 110a and 112a together form a class AB buffer stage to provide additional buffering to signals from circuit stacks 106a and 108a. Together the circuit stacks 106a, 108a, 110a, and 112a can operate as a diamond-style class AB buffer.

As illustrated in FIG. 1A, the power sources to the circuit stacks can be derived from the DC supply Vcc, the noninverting input signal Vsigp, or the inverting input signal Vsigm. Unlike power connections to the DC supply Vcc, the circuit stacks 106a and 110a are shown to be connected between the first terminal of the DC blocking capacitor C1a and ground. This allows the circuit stacks 106a and 110a to receive power from the noninverting input signal Vsigp which has a DC component equal or almost equal to the DC supply Vcc. In making this connection the transistors QP3a, QP4a, and QP5a, which form a current mirror, each have an emitter connected to the first terminal of the DC blocking capacitor C1a. This allows the generation of the bias voltage Vbias1a to be level shifted with respect to the noninverting input signal and to set up a replica current Ibias in the PNP QP4a and the PNP QP5a. In analogy, the circuit stacks 106b and 110b receive power from the inverting input signal Vsigm which has a DC component equal or almost equal to the DC supply Vcc. Further details of these connections are described below with respect to how the stages form the diamond-style class AB buffer.

The circuit stack 106a includes the PNP QP4a, the PNP QP10a, and the NPN QN1a connected between the first terminal of the DC blocking capacitor C1a and ground. The PNP QP4a has an emitter connected to the first terminal of the DC blocking capacitor C1a, a base connected to the base of PNP QP3a, and a collector connected to an emitter of PNP QP10a so as to operate as a current source 104a. The PNP QP10a has a base connected to the second terminal of the DC blocking capacitor C1a (the noninverting buffer input node), the emitter connected to the collector of PNP QP4a, and a collector connected to the collector of NPN QN1a. The PNP QP10a operates as an emitter follower. This transistor can be referred to as an amplifying transistor 102a and/or as a follower transistor. Any of the follower transistors discussed herein can have approximately a unity gain. Any of the follower transistors discussed herein can have gain that is close to a unity gain, such as a gain in a range from about 0.9 to 1.0. Also, the collector of NPN QN1a is connected to its base, and the emitter of NPN QN1a is connected to ground. In this way, the NPN QN1a is diode connected and can mirror current to the circuit stack 108a via NPN QN2a.

The circuit stack 108a includes an NPN QN5a, an NPN QN10a, and an NPN QN2a connected between the DC supply Vcc and ground. The NPN QN5a has a base and collector connected to the DC supply Vcc and an emitter connected to a collector of NPN QN10a. One purpose of QN5a can be to reduce some of the collector-to-emitter voltage across the NPN QN10a. The NPN QN10a has a base connected to the second terminal of the DC blocking capacitor C1a, which is the noninverting buffer input node, and an emitter connected to a collector of NPN QN2a. In this way the NPN QN10a operates as an emitter follower. This transistor can be referred to as an amplifying transistor 103a and/or as a follower transistor. The NPN QN2a has a base connected to the base of NPN QN1a and an emitter connected to ground. The NPN QN2a can operate as a current source 105a mirroring the bias current Ibias from the NPN QN1a of the circuit stack 106a.

The circuit stack 110a includes a PNP QP5a, an NPN QN6a, a PNP QP8a, and an NPN QN3a connected between the first terminal of the DC blocking capacitor C1a and ground. The PNP QP5a has an emitter connected to the first terminal of the DC blocking capacitor C1a, a base connected to the base of PNP QP3a, and a collector connected to a collector and base of NPN QN6a. The NPN QN6a is diode connected and has a base connected to the emitter of PNP QP10a of the circuit stack 106a. The emitter of NPN QN6a is connected to an emitter of PNP QP8a. The PNP QP8a is diode connected and has a base and a collector both connected to the emitter of NPN QN10a of circuit stack 108a. The NPN QN3a has a base connected to the base of NPN QN1a, an emitter connected to ground, and a collector connected to the collector and base of PNP QP8a. Similar in function to that of the NPN QN2a, the NPN QN3a can operate as a current source mirroring the bias current Ibias from the NPN QN1a of the circuit stack 106a.

The circuit stack 112a includes an NPN QN7a and a PNP QP9a connected between the DC supply Vcc and ground. The NPN QN7a has a collector connected to the DC supply Vcc, a base connected to the base of NPN QN6a of the circuit stack 110a, and an emitter connected to the emitter of QP9a. The PNP QP9a has a collector connected to ground, a base connected to the base of PNP QP8 of the circuit stack 110a, and an emitter connected to the emitter of NPN QN7a. As described above, the circuit stacks 110a and 112a form a class AB buffer for signals from the diamond-style input amplifier stage formed by circuit stacks 106a and 108a. The circuit stacks 110a and 112a operate to provide large current output drive through the operation of the NPN QN7a and PNP QP9a configured as emitter followers. By virtue of the way the circuit stacks 110a and 112a are interconnected, current is pushed from the emitter of NPN 7a while current is pulled by the emitter of PNP 9b, and the circuit stacks 110a and 112a are interconnected so as to cause the product of the emitter currents in NPN QN7a and PNP QP9a to be constant. This can also be referred to as feedback class-AB biasing (FBB).

Additionally the resistor RXa is shown connected between a noninverting output node and the emitters of NPN QN7a and PNP QP9a. The resistor RXa can be used for RF impedance matching purposes so as to provide a matched interface between the noninverting output node and a successive stage. For instance the resistor RXa can be used to match an output impedance to fifty ohms.

The connections and operation of the circuit stacks 106b-112b can be similar to that of the circuit stacks 106a-112a. The circuit stack 106b includes the PNP QP4b, the PNP QP10b, and the NPN QN1b. The circuit stack 108b includes the NPN QN5b, the NPN QN10b, and the NPN QN2b. Also, the circuit stack 110b includes the NPN QN6b, the PNP QP8b, and the NPN QN3b, and the circuit stack 112b includes the NPN QN7b and the PNP QP9b.

The circuit stacks 106b and 108b together form a diamond-style input amplifier stage which receives the second input signal V1b at the inverting buffer input node; and circuit stacks 110b and 112b together form a class AB buffer stage to provide additional buffering to signals from circuit stacks 106b and 108b. Together the circuit stacks 106b, 108b, 110b, and 112b can operate as a diamond-style class AB buffer.

The circuit stacks 106a-112a can together form the core stages for a single ended diamond-style class AB buffer stage with connections to the first terminal of the DC blocking capacitor C1a, the second terminal of the DC blocking capacitor C1a (noninverting buffer input node), the DC supply Vcc, and the noninverting output node. The circuit stacks 106b-112b form the core stages for a single ended diamond-style class AB buffer with connections to the first terminal of the DC blocking capacitor C1b, the second terminal of the DC blocking capacitor C1b (inverting buffer input node), the DC supply Vcc, and the inverting output node. The connections of circuit elements and components with a "b" suffix and like numbers are analogous to those with an "a" suffix, and the description of these connections is omitted in the interest of brevity.

Figure 1B:
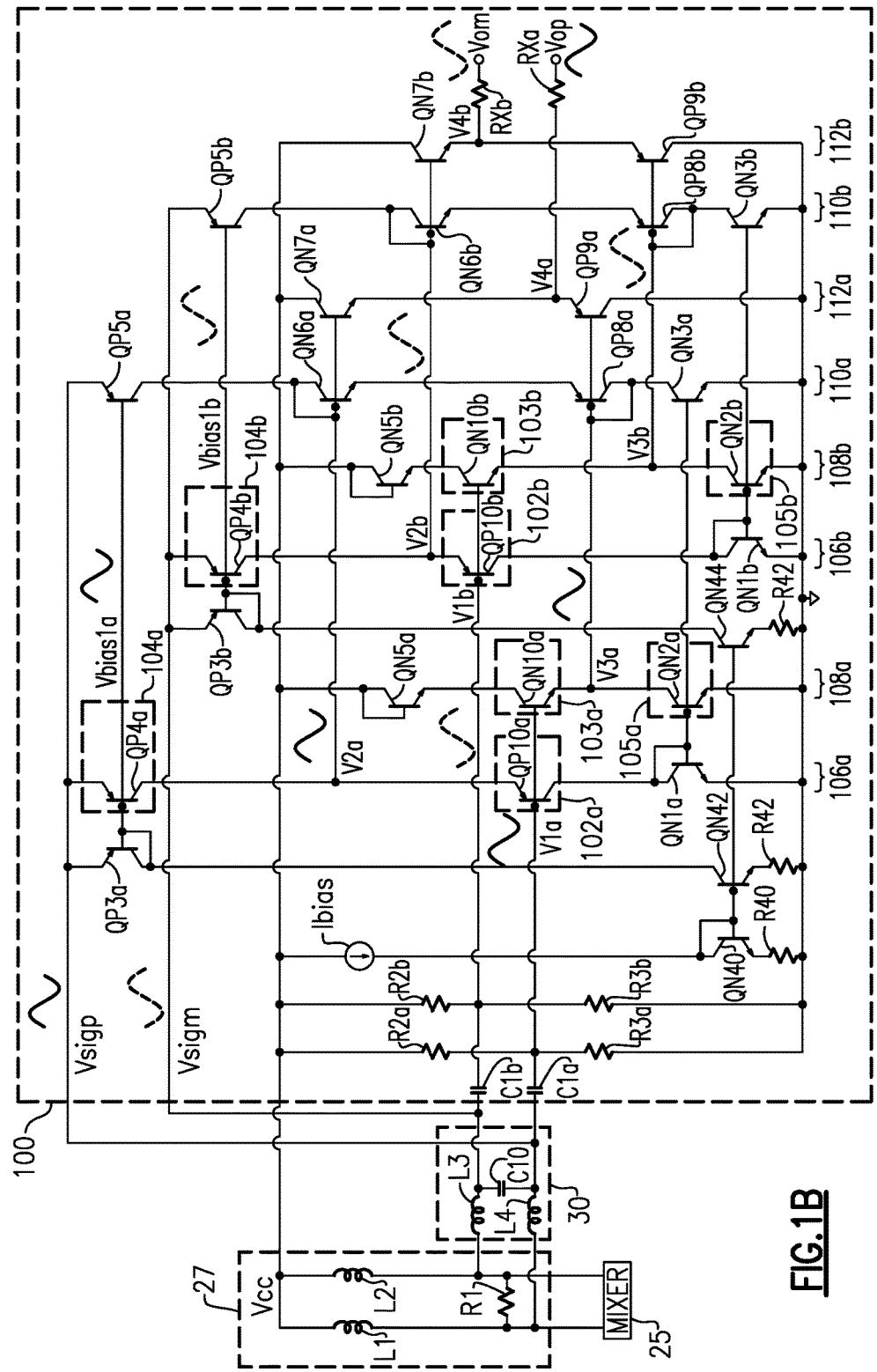
FIG. 1B shows the annotated signal waveforms on the schematic diagram of FIG. 1A in accordance with the teachings herein.

FIG. 1B shows annotated signal waveforms on the schematic of FIG. 1A. The connection of select circuit stacks to either the first terminal of the DC blocking capacitor C1b or the first terminal of the DC blocking capacitor C1a can provide an alternative power source for the select circuit stack. The annotated signals illustrate relationships of signal phases along the signal paths. In FIG. 1B there are two signal paths, a noninverting signal path starting from the first terminal of the DC blocking capacitor C1a, which provides the noninverting input signal Vsigp, and a complementary signal path starting from the first terminal of the DC blocking capacitor C1b, which provides the inverting input signal Vsigm. As shown in FIG. 1B, the annotated signals along the noninverting signal path are shown with solid lines while the annotated signal along the inverting signal path are shown with dashed lines.

The annotated signals, shown with solid lines, along the noninverting signal path include the noninverting input signal Vsigp, the first input signal V1a at the second terminal of the DC blocking capacitor C1a (noninverting buffer input node), the signal V2a at the emitter of PNP QP10a, the signal V3a at the emitter of NPN QN10a, the signal V4a at the emitters of QN7a and QP9a, and the output signal Vop. The annotated signals, shown with dashed lines, along the complementary (inverted) signal path include the inverting input signal Vsigm, the signal V1b at the second terminal of the DC blocking capacitor C1b (inverting buffer input node), the signal V2b at the emitter of PNP QP10b, the signal V3b at the emitter of NPN QN10b, the signal V4b at the emitters of QN7b and QP9b, and the output signal Vom. In addition, the bias voltages Vbias1a and Vbias1b are annotated as sinusoidal signals. The bias voltage Vbias1a is shown as being in phase with the noninverting input signal Vsigp, and the bias voltage Vbias1b is shown as being in phase with the inverting input signal Vsigm.

As shown in FIG. 1B, the signals at nodes in the signal chain are sine-wave signals. As shown, the noninverting input signal Vsigp and the inverting input signal Vsigm can be opposite in phase. Following the signal path of the first input signal V1a, the first input signal V1a is shifted up by PNP QP10a, operating as an emitter follower, to the signal V2a. The first input signal V1a is also shifted down by the NPN QN10a, operating as an emitter follower, to the signal V3a. The signals V2a and V3a drive the bases of the NPN QN7a and PNP QP9a which operate in class AB as emitter followers to provide the signal V4a.

The headroom in the output circuit stack of the NPN QN7a and the PNP QP9a followers should not be the dominant limit on the OP1dB of the buffer 100a because the signal V2a at the base of the NPN QN7a could swing to the DC supply Vcc and above without clipping the signal V4a.

The headroom can be limited by the PNP QP4a and the NPN QN2A, which operate as current sources 104a and 105a to bias the PNP QP10a and NPN QN10a as followers in the amplifier stages (or stacks) 106a and 108a. When the current source 104a is connected to the DC supply Vcc, instead of the noninverting input node, the signal V2a can only swing to within a few hundred millivolts of Vcc before the output impedance of the PNP QP4a, current source 104a, collapses. The loss, or collapse, of the current mirror output impedance can give rise to nonlinear behavior and can consequently reduce OP1db. The same headroom constraints exist in the complementary half of the circuit corresponding to the inverting input signal Vsigm. The complementary signals along the inverting (complementary) signal path can behave similarly as the signals along the noninverting signal path, but the signals in the different signal paths are 180 degrees out of phase with each other.

As described above, the emitters of transistors of the current mirror formed by PNP QP3a, QP4a, and QP5a are connected to the first terminal of the DC blocking capacitor C1a so that power to the circuit stacks 106a and 110a is derived from the noninverting input signal Vsigp instead of the DC supply Vcc. This can advantageously augment headroom and also allow the collector currents of PNP QP3a, QP4a, and QP5a to remain substantially constant. As shown in FIG. 1B, when the signal V2a swings towards Vcc the noninverting input signal Vsigp is in phase and swings the current source "supply" and base voltages up with the input signal, effectively swinging the current source up out of the way of the signal. This can advantageously allow the signal V2a to swing higher compared to a circuit using circuit stacks which receive power from the DC supply Vcc.

Also as described above, the circuit stacks 108a and 112a receive power from the DC supply Vcc. While this may not avail additional headroom for the current source 105a below the NPN follower at V3a, more headroom can be availed by virtue of the input DC bias levels. The input DC bias voltage provided by the resistor divider of resistors R3a and R3b can now be raised to give some of the additional headroom to the current sources 105a and 105b below the NPN followers, amplifying transistors 103a and 103b, in the input stacks.

The complementary signal path can behave similarly to the noninverting signal path except that the signals are inverted.

A simulation of the electronic system using the buffer 100 as shown in FIG. 1A indicates an increase in signal headroom. In a particular application, the increase in headroom resulted in about a 3 dB increase in buffer OP1dB from 10 dBm up to 13 dBm. This in turn can translated to about a 3 dB increase in the IP1dB at the mixer input allowing enhanced linearity for a wider range of input signals. The simulation also showed that the IIP3 of the buffer was unchanged when simulated at frequencies up to 400 MHz.

A circuit analysis of the electronic system of FIG. 1A shows that the driving point impedances derived with respect to the noninverting and inverting buffer input signals Vsigp and Vsigm, respectively, can be such that the conversion gain of the mixer is not reduced by loading from the circuit stacks 106a-b, 108a-b, 110a-b, and 112a-b.

Figure 2:
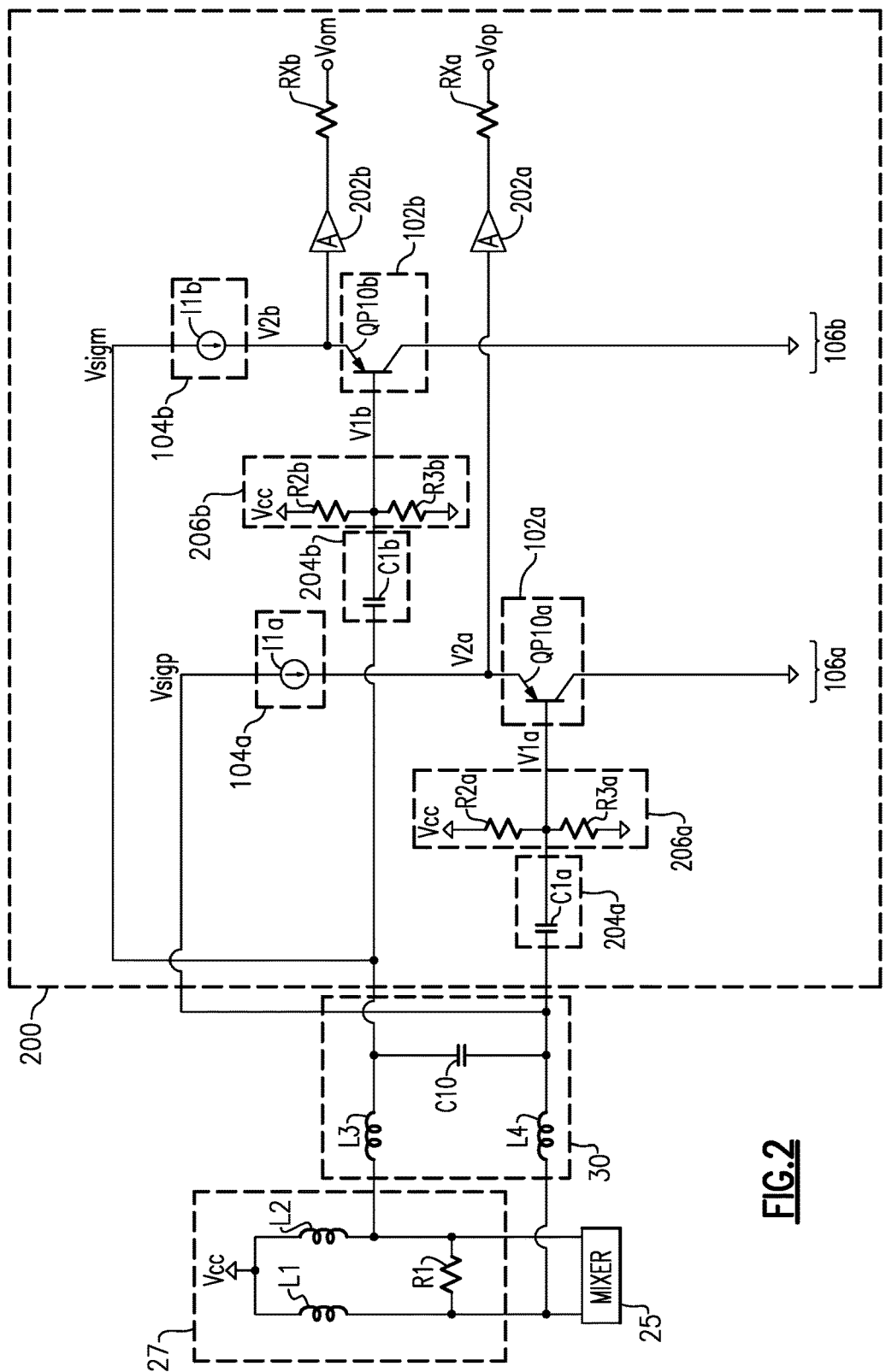
FIG. 2 is a schematic diagram of a differential amplifier in accordance with the teachings herein.

FIG. 2 is a schematic diagram of a differential amplifier 200 in accordance with the teachings herein. FIG. 2 illustrates a buffer topology that is different than FIG. 1A. The buffer topology includes the mixer 25, the mixer load 27, the filter 30, and a buffer 200. The connections and operation of the mixer 25, the mixer load 27, and the filter 30 are similar to that of FIG. 1A. The mixer 25, the mixer load 27, and the filter 30 provide the noninverting input signal Vsigp at the first terminal of the DC blocking capacitor C1a 204a and the inverting input signal Vsigm at the first terminal of the DC blocking capacitor C1b 204b. The noninverting and inverting input signals Vsigp and Vsigm can have a DC component equal or almost equal to the DC supply Vcc and an AC signal component; the DC component and the AC signal component can advantageously be used to provide power to select circuit stacks of the differential circuit 200 for increased headroom.

The differential circuit 200 includes the DC blocking capacitors C1a 204a and C1b 204b, bias circuits 206a-b, circuit stacks 106a-b, amplification stages 202a-b, and output resistors R2a-b. The circuit stack 106a has a current source 104a and an amplifying transistor 102a connected between the noninverting buffer node and ground. The circuit stack 106b has a current source 104b and an amplifying transistor 102b connected between the inverting buffer node and ground. The amplifying transistor 102a is a PNP QP10a and the amplifying transistor 102b is a PNP QP10b.

In the circuit stack 106a, the current source 104a is connected between a node configured to receive the input signal Vsigp and an emitter of PNP QP10a, and the collector of PNP QP10a is connected to ground. The amplification stage 202a can represent one or more stages of a multi-stage amplifier, such as a buffer with a gain that is approximately a unity gain. In the illustrated differential circuit 200, the amplification stage 202a is electrically coupled between the circuit stack 106a to the noninverting output Vop. In the circuit stack 106b, the current source 104b is connected between a node configured to receive the inverting input signal Vsign and an emitter of PNP QP10b, and the collector of PNP QP10b is connected to ground. The amplification stage 202b can also represent multiple stages of a multi-stage amplifier or buffer and can represent the connections from the circuit stack 106b to the inverting output Vom.

The circuit stack 106a receives power from the noninverting input signal Vsigp and receives the first input signal V1a at the base of PNP QP10a which is the control input of the amplifying transistor 102a. The first input signal V1a, which can represent the first input signal V1a of FIG. 1A, has the same AC signal component as the noninverting input signal Vsigp superimposed upon a DC bias voltage determined by the bias circuit 206a. As illustrated, the DC bias voltage is provided from the resistor divider of R2a and R3a connected between the DC supply Vcc and ground, while the AC signal component is coupled by the coupling network, DC blocking capacitor C1a, to the base of PNP QP10a. In other implementations, any suitable bias circuit can be implemented to provide the DC bias voltage. By connecting the circuit stack 106a to the first terminal of the DC blocking capacitor C1a so that it receives power from the noninverting input signal Vsigp instead of the DC supply Vcc, more headroom can be availed for the signal V2a. The signal V2a can be in phase with the noninverting input signal Vsigp so that the current source 104a does not lose support voltage or collapse when the signal V2a exceeds the DC supply voltage Vcc. This allows the first input signal V1a to extend to a higher voltage so that the circuit stack 106a has a higher common mode range. In addition, the DC bias from the bias circuit 206a can be tailored to a higher voltage allowing the first input signal V1a to also swing to lower values. When measured at RF or IF frequencies, the enhancement of circuit stack headroom improves linearity and increases OP1dB.

Figure 3:
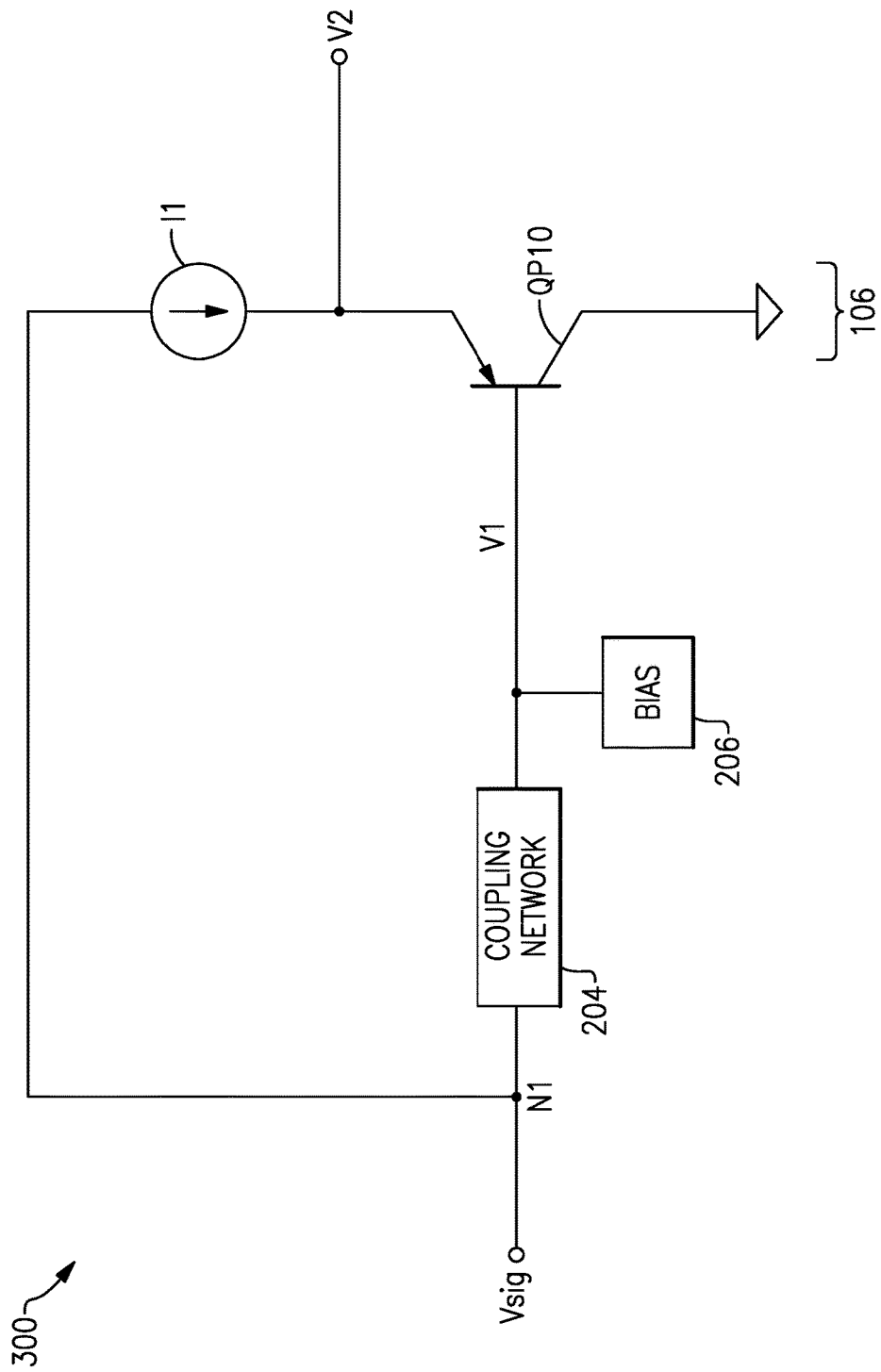
FIG. 3 is a top-level schematic diagram of a single-ended circuit in accordance with the teachings herein.

FIG. 3 is a schematic diagram of a single-ended circuit 300 in accordance with the teachings herein. The single-ended circuit 300 includes a coupling network 204, a bias network 206, an amplifying transistor PNP QP10, and a current source I1. The circuit stack 106 is the amplifying transistor PNP QP10 and the current source I1 which are configured as an emitter follower with the current source I1 operating as an active load. The current source I1 is connected between a node N1 and the emitter of the PNP QP10.

As illustrated in FIG. 3, the first terminal of the coupling network 204, which receives the input signal Vsig, is also connected to the node N1. Node N1 is a node that provides a power supply voltage to the current source I1. Node N1 is a signal path to the input of the follower transistor QP10. The node N1 can be in the signal path from an output of a mixer, such as the mixer 25 of FIGS. 1 and/or 2, and the follower transistor QP10. A second terminal of the coupling network 204 is connected to a base of the PNP QP10. Although the circuit stack 106 is configured as an emitter follower having a collector connected directly to ground, other configurations are possible. For instance, a passive or active device could be placed in series between the collector of the PNP QP10 and ground.

The circuit stack 106 operates as an emitter follower to buffer a stage input signal V1 so that an output signal V2 has increased power and follows the stage input signal V1. The output signal V2 can become clipped, meaning distorted or limited, when the input signal exceeds a common mode range value. The common mode range is the minimum and maximum voltage value the stage input signal V1 can swing without causing the stage output signal V2 to become clipped. The common mode range can also be referred to as signal headroom or headroom.

The stage output signal V2 can become clipped when the current source I1 no longer operates as an active load. This can occur when a support voltage across a mirror transistor, such as the PNP QP4a of FIG. 1A, becomes too small (e.g., about a few hundred millivolts). Accordingly, the stage output signal V2 can clip or become clipped when it reaches a value which is within a few hundred millivolts of the input signal Vsig.

The single-ended circuit 300 uses the input signal Vsig as its source of power. Accordingly, the input signal Vsig provides the quiescent current for the current source I1 without being loaded. As such, the impedance of the source providing the input signal Vsig is less than the impedance presented by the circuit stack 106. A mixer such as the mixer 25 of FIGS. 1A and 1B is an example of a source which can provide noninverting and inverting input signals, Vsigp and Vsigm, having a DC component equal or approximately equal to a DC supply Vcc. The input signal Vsig can in general be a signal which provides an AC component, such as an IF signal from the mixer 25 of FIG. 1A, superimposed upon a DC component; additionally the input signal can have power capable of driving one or more circuit stacks such as circuit stack 106.

Accordingly, the current source I1 can receive a power supply voltage with an alternating current component and the direct current component, in which the alternating current component has substantially the same frequency and magnitude as the input V1 to the follower transistor QP10. The current source I1 can bias the follower transistor QP10 such that the output signal V2 can achieve a voltage magnitude that is greater than a voltage magnitude of the direct current component of the power supply signal. The voltage boost provided to the current source I1 that corresponds to the input V1 to the follower transistor QP10 can increase the headroom of the single-ended circuit 300.

The coupling network 204 can be any suitable network, such as a capacitor or DC blocking capacitor, which couples the AC component of the input signal Vsig to the input node of the circuit stack 106. The bias network 206 can be a voltage bias level such as a DC bias derived from a resistor divider dividing a supply voltage. The bias network 206 can provide a DC bias which has a different value from the DC component of the input signal Vsig. For instance the DC bias can be one half of the DC component. Connecting the first terminal of the coupling network 204 to the circuit stack 106 so that the circuit stack 106 receives power from the input signal Vsig allows the circuit stack to operate with enhanced headroom. The AC component of the input signal Vsig can be in phase with the stage input signal V1 so that the current source 106 does not lose support voltage when the output signal V2 exceeds a level equal or almost equal to the DC component of the input signal Vsig. Accordingly, the stage input signal V1 can swing to an amplitude exceeding the DC component of the input signal when the AC component of the stage input signal V1 and the AC component of the input signal Vsig allow the current source 106 to have support voltage. For instance, when the input signal Vsig and the stage input signal V1 are in phase, similar to the phase relationships shown in FIG. 1B, then it is possible for the stage output signal V2 to exceed the DC component of the input signal without clipping. This in turn avails more headroom and extends common mode range to the stage input signal V1. This extension in common mode range can be proportional to the amplitude of the AC component of the input signal Vsig. For an IF buffer, the increase in headroom can avail an increase in the 1 dB compression point OP1dB.

As discussed above, circuits disclosed herein enable a voltage at the output of a follower transistor to exceed a DC power supply voltage without clipping. In some implementations, the circuits disclosed herein can allow the voltage at the output of the follower transistor to swing to a higher voltage without clipping, in which the higher voltage does not exceed the DC power supply voltage. For example, in certain embodiments, superimposing an input signal on a DC power supply voltage can enable a follower transistor to provide a maximum voltage at the output of the follower transistor to be to 200 mV below the DC power supply voltage without clipping compared to the maximum voltage at the output of the follower being 800 mV below the DC power supply voltage without clipping when just the DC power supply voltage is provided to a current source configured to bias the output of the follower transistor. Accordingly, the linear signal range can be improved in circuits implemented in accordance with the principles and advantages discussed herein.

Figure 4:
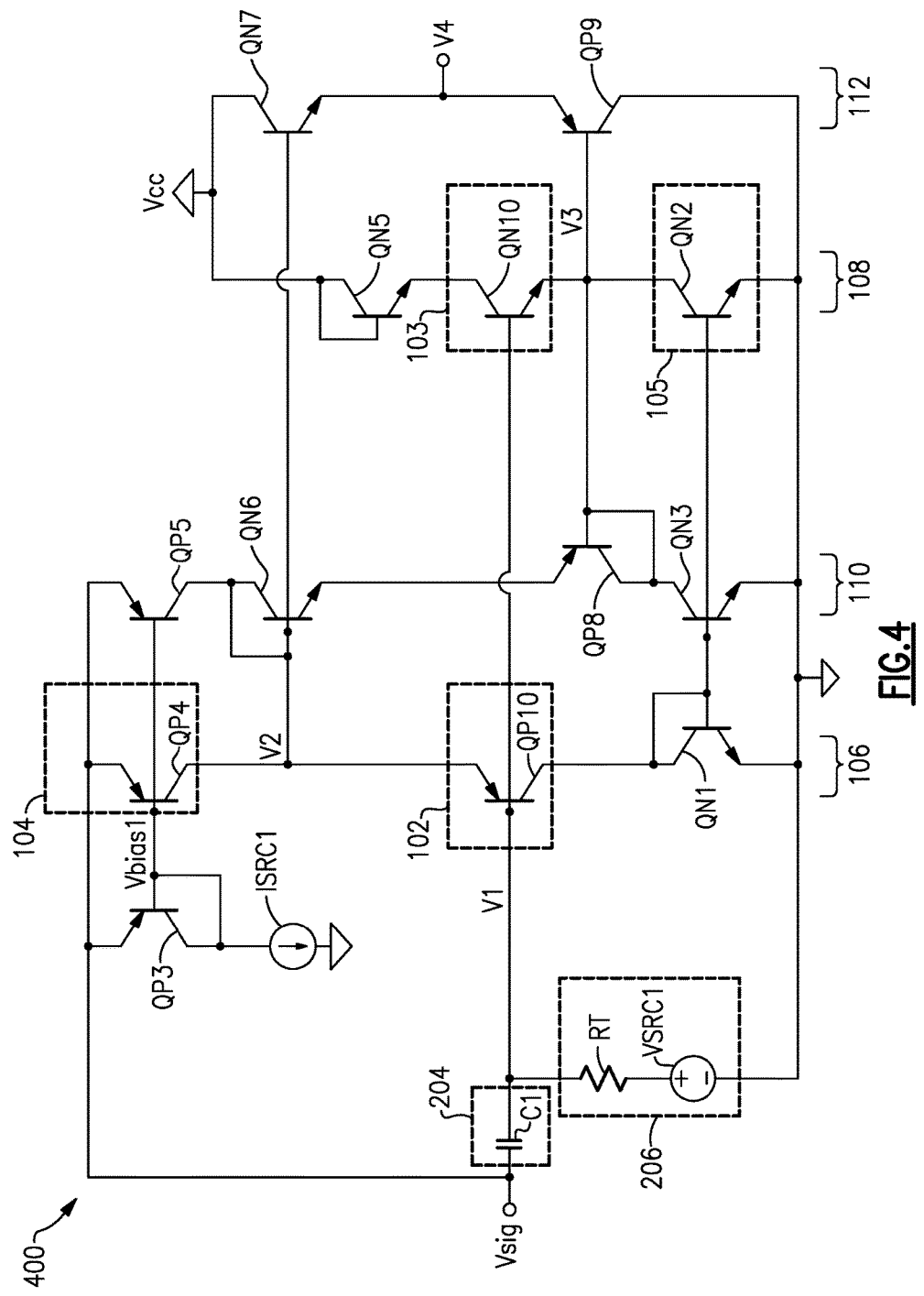
FIG. 4 is a single-ended diamond-style class-AB IF buffer according to an embodiment.

FIG. 4 is a single-ended diamond-style class-AB IF buffer 400 according to an embodiment. The buffer 400 can be a single-ended implementation of the buffer 100 of FIGS. 1A and 1B, and the description of the operation and connection of components and circuit stacks with like numerals can be similar to that of FIGS. 1A and 1B. The buffer 400 includes the coupling network 204, the bias network 206, circuit stacks 106, 108, 110, 112, a current source ISRC1, and a PNP QP3.

The circuit stack 106 includes the current source 104, the amplifying transistor 102, and the NPN QN1. The circuit stack 110 includes the PNP QP5, the NPN QN6, the PNP QP8, and the NPN QN3. The circuit stack 108 includes the NPN QN5, the amplifying transistor 103, and the current source 105. Also, the circuit stack 112 includes the NPN QN7 and the PNP QP9. The amplifying transistor 102 is PNP QP10, and the amplifying transistor 103 is the NPN QN10. The current source 104 is the PNP QP4, and the current source 105 is the NPN QN2.

Circuit stacks 106 and 110 are shown receiving power from the input signal Vsig while circuit stacks 108 and 112 are shown receiving power from the DC supply Vcc. Also, in comparison to the buffer 100 of FIGS. 1A and 1B, biasing has been simplified. As shown the bias network 206 has been simplified to include a resistor RT and a bias source VSRC1 placed in series between the buffer input node and ground. Also, the NPN mirroring has been simplified as a current source ISRC1 connecting directly to the diode-connected PNP QP3. Similar to the current source Ibias of FIGS. 1A and 1B, the current source ISRC1 can sink a current ISRC1 having a DC value of current.

FIG. 4 shows how the connection of the first terminal of the coupling network 204 to the circuit stacks 106 and 110 raises the emitter voltages of the PNPs QP3-QP5. This can in turn raise the headroom of the circuit stacks 106 and 110 by availing more support voltage for the PNP QP4 and the PNP QP5. Accordingly, the circuit stacks 106 and 110 can operate so as to not clip signals such as the output signal V2 when V2 exceeds a DC component of the input signal Vsig. For instance, the DC component of the input signal Vsig can be the DC supply voltage Vcc. As described above, the circuit stacks 108 and 112 can remain connected to the DC supply Vcc. Although not shown in FIG. 4, other suitable configurations are possible.

Figure 5:
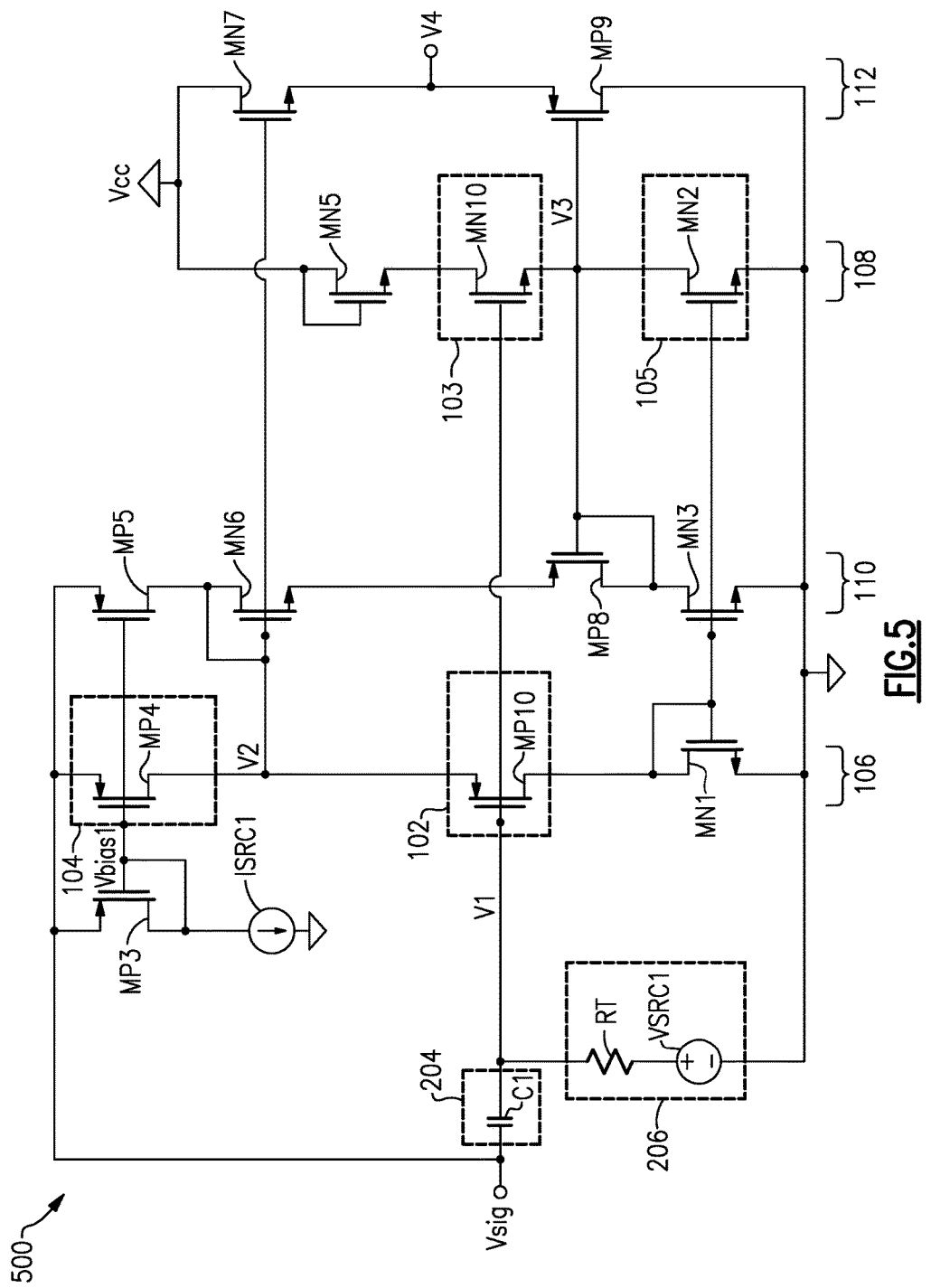
FIG. 5 is a single-ended diamond-style class-AB IF buffer according to another embodiment.

FIG. 5 is a single-ended diamond-style class-AB IF buffer 500 according to another embodiment. The buffer 500 is similar to the buffer 400 of FIG. 4 except it uses field effect transistors (FETs) instead of bipolar junction transistors. Otherwise, the buffer 500 can be functionally similar to the buffer 400 of FIG. 4. The FETs can be metal oxide semiconductor FETs (MOSFETs), for example. Any of the principles and advantages discussed herein can be implemented with any suitable transistor technology.

Although the buffers shown in FIG. 1A-B through FIG. 5 describe illustrative buffers, other circuit topologies and configurations are possible. For instance, the principles and advantages discussed herein can be applied to different circuit topologies. Alternatively or additionally, additional headroom can be applied on the GND side of a circuit. For instance, an input signal to an amplifier transistor can be superimposed on a ground signal provided to a current source configured to bias the amplifier transistor. In some circuit configurations, one or more of the inductors in the embodiments discussed above can be implemented by integrated inductors. One or more of the inductors in the embodiments discussed above can be off-chip inductors. Inductors or other circuit elements other than those in a signal path between a mixer and an amplifier, such as a buffer, can be coupled to a current source to provide a boost to a power supply to increase the headroom of the amplifier. Any suitable principles and advantages discussed herein can be implemented in connection with single-ended or differential circuits.

Applications

Devices employing the above extended common-mode range buffers can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although the innovations have been described in terms of certain embodiments, other embodiments that are apparent to those of ordinary skill in the art, including embodiments that do not provide all of the features and advantages set forth herein, are also within the scope of this disclosure. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus with biasing for buffering an input signal, the apparatus comprising:
a follower transistor configured to receive the input signal and to provide a buffered version of the input signal at an output; and
a current source electrically coupled to the follower transistor, the current source configured to provide a bias to the output of the follower transistor, the current source configured to receive a power supply voltage comprising an alternating current component and a direct current component;
wherein the alternating current component of the power supply voltage has substantially the same frequency as the input signal received by the follower transistor.

2. The apparatus of claim 1, wherein the power supply voltage has substantially the same magnitude as the input signal received by the follower transistor.

3. The apparatus of claim 1, wherein the power supply voltage comprises the input signal superimposed on a supply voltage.

4. The apparatus of claim 1, wherein the power supply voltage is provided from a node in a signal path to the input of the follower transistor.

5. The apparatus of claim 4, further comprising a mixer and a direct current blocking capacitor, wherein the signal path is from an output of the mixer to the input of the follower transistor, and wherein the direct current blocking capacitor is electrically coupled between the node in the signal path and the input of the follower transistor.

6. The apparatus of claim 1, wherein the input signal is an intermediate frequency signal.

7. The apparatus of claim 1, wherein the follower transistor is included in an input stage of a diamond buffer.

8. The apparatus of claim 7, wherein the diamond buffer is a class AB diamond buffer.

9. The apparatus of claim 1, further comprising another follower transistor configured to buffer the input signal, the follower transistor and the other following transistor being of opposite conductivity types.

10. The apparatus of claim 1, wherein the current source comprises a current mirror.

11. The apparatus of claim 1, further comprising:
a second follower transistor configured to receive a second input signal and provide a buffered version of the second input signal, wherein the first input signal and the second input signal are differential signals; and a second current source configured to provide a second bias to an output of the second follower transistor, wherein the second current source is configured to receive a second power supply voltage that is different than the power supply voltage.

12. The apparatus of claim 1, wherein the follower transistor is included in an input stage, the apparatus further comprising:

a second stage follower transistor configured to receive the buffered version of the input signal and to provide an output signal; and a second stage current source configured to receive a different power supply voltage than the power supply voltage received by the current source, and to provide a second stage bias to an output of the second stage follower transistor.

13. The apparatus of claim 1, wherein the follower transistor is a bipolar transistor, a base of the bipolar transistor is configured to receive the input signal, and a collector of the bipolar transistor is configured to provide the buffered version of the input signal.

14. An electronic system with biasing for buffering an input signal, the electronic system comprising:

a mixer comprising an output;

a buffer amplifier comprising:

a follower transistor configured to buffer the input signal received at an input of the buffer amplifier; and a current source configured to bias an output of the follower transistor; and a signal path between the output of the mixer and the input of the buffer amplifier, wherein the current source is configured to receive a power supply voltage from a node in the signal path.

15. The electronic system of claim 14, wherein the signal path comprises a direct current blocking capacitor electrically coupled between the node in the signal path and the input of the buffer amplifier.

16. The electronic system of claim 14, wherein the signal path comprises a filter electrically coupled between the output of the mixer and the node in the signal path.

17. A method of biasing a transistor for increased common mode range of an input signal, the method comprising:

providing, using the transistor, an output signal in response to the input signal; and biasing an output of the transistor based on a power supply signal having an alternating current component and a direct current component such that a common mode range of the input signal is increased by an amount proportional to the alternating current component of the power supply signal.

18. The method of claim 17, wherein the biasing is preformed using a current source configured to receive the power supply signal.

19. The method of claim 18, wherein the current source comprises a first bipolar transistor and the transistor comprises a second bipolar transistor configured as an emitter follower.

20. The method of claim 17, wherein the power supply signal is provided by an input of a coupling network, and an input of the transistor is coupled to an output of the coupling network.

* * * * *